United States Patent [19]

Saito

[11] Patent Number: 4,476,479
[45] Date of Patent: Oct. 9, 1984

[54] SEMICONDUCTOR DEVICE WITH OPERATING VOLTAGE COUPLING REGION

[75] Inventor: Shozo Saito, Yokohama, Japan

[73] Assignee: Tokyo Shibaura Denki Kabushiki Kaisha, Japan

[21] Appl. No.: 247,156

[22] Filed: Mar. 24, 1981

[30] Foreign Application Priority Data

Mar. 31, 1980 [JP] Japan .................. 55-40209
Dec. 19, 1980 [JP] Japan .................. 55-178941

[51] Int. Cl.³ .................................. H01L 27/02
[52] U.S. Cl. .................................. 357/42; 357/41; 357/43; 357/23; 307/304
[58] Field of Search .................. 357/13, 41, 43, 42, 357/23; 307/304

[56] References Cited

U.S. PATENT DOCUMENTS

| | | | |
|---|---|---|---|
| 3,447,046 | 3/1969 | Cricchi et al. | 317/235 |
| 3,758,831 | 9/1973 | Clark | 357/13 |
| 3,849,216 | 11/1974 | Salters | 357/42 |
| 4,225,877 | 9/1980 | Miles et al. | 357/41 |
| 4,327,368 | 4/1982 | Uchida | 357/43 |

FOREIGN PATENT DOCUMENTS 52-14383  2/1977  Japan ..................... 357/23

OTHER PUBLICATIONS

Capece, R. P., "Older Processes Revamped as New Arrivals Extend Performance Limits" *Electronics*, pp. 109-115, Sep. 1979.

Ghafghaichi et al., "Complementary Bipolar FET Structure" *IBM Tech. Discl. Bull.*, vol. 16, No. 6, pp. 1702-1703, Nov. 1973.

O. Minato, et al., "Buried J-FET Powered Static RAM Cell", *Digest of Technical Papers: Eleventh Conference on Solid State Devices*, Tokyo 159 (1979).

Primary Examiner—Martin H. Edlow
Attorney, Agent, or Firm—Finnegan, Henderson, Farabow, Garrett & Dunner

[57] ABSTRACT

A semiconductor device includes a semiconductor substrate of a first conductivity type and a semiconductor layer of a second conductivity type opposite to the first conductivity type formed on the substrate. In the layer are formed a first semiconductor region of the first conductivity type, having a low impurity concentration and formed deep; and a second semiconductor region in a surface area of the layer including the surface of the first semiconductor region. The second region has an impurity concentration higher than that of the first region and formed shallower than it. A power source voltage terminal is connected to the substrate and supplies a voltage applied thereto to the second region through the substrate and the layer.

19 Claims, 7 Drawing Figures

SEMICONDUCTOR DEVICE WITH OPERATING VOLTAGE COUPLING REGION

BACKGROUND OF THE INVENTION

I. Field of the Invention

The present invention relates to a semiconductor device and, more particularly, to a semiconductor device of improved integration which is suitable to be used as an MOS transistor integrated circuit.

II. Description of the Prior Art

Recent improvements in integration in MOS transistor integrated circuits are immense. The main factor which supported such improvements in high integration is the technological development for reducing the element size. Multi-wiring technique has also contributed to these improvements. For example, it has been proposed to eliminate the aluminum wiring from the memory cell using a buried J-FET and to reduce the memory cell area so as to attain a high integration density CMOS IC as described in C. Minato et al, "Buried J-FET Powered Static RAM Cell" Digest of Tech. Papers, The 11th Conf. on Solid State Devices, Tokyo, 1979.

FIG. 1 is a cross sectional view of a conventional enhancement-depletion (E/D) type inverter circuit device formed by an enhancement type MOS transistor and a depletion type MOS transistor. As shown in this figure, n-type semiconductor regions 2, 3 and 4 are formed in a p-type semiconductor substrate 1. A gate electrode 6 is formed on an insulation layer 5, above the area of the semiconductor substrate 1 between the semiconductor regions 2 and 3. Similarly, a gate electrode 7 is formed on the insulation layer 5 above the area of the semiconductor substrate 1 between the semiconductor regions 3 and 4.

A donor impurity is ion-implanted in the surface area (channel portion) of the semiconductor substrate 1 between the semiconductor regions 2 and 3 so as to make the threshold voltage negative (e.g., $-2$ V), thus providing a depletion type MOS transistor having the semiconductor region 2 as a drain region and the semiconductor region 3 as a source region. An acceptor impurity is ion-implanted in the surface area (channel portion) of the semiconductor substrate 1 between the semiconductor regions 3 and 4 so as to make the threshold voltage positive (e.g., $+1$ V), thus providing an enhancement type MOS transistor having the semiconductor region 3 as a drain region and the semiconductor region 4 as a source region.

According to this construction, the drain region 2 of the depletion type MOS transistor is connected to a power source voltage terminal VD, and the source region 3 and the gate electrode 6 are commonly connected to the output terminal VOUT. The gate electrode 7 of the enhancement type MOS transistor is connected to an input terminal VIN, and the source region 4 is connected to a ground terminal VS1. The semiconductor substrate is connected to a ground terminal VS2. An E/D inverter circuit is thus formed.

As may be seen from the above construction, with a semiconductor device comprising a conventional E/D type inverter circuit device, a total of four kinds of wirings are required on the same surface of a substrate, i.e., the input terminal connecting wiring, the output terminal connecting wiring, the power source connecting wiring, and the grounding wiring, and the freedom of design of the wirings is limited. As a result, high integration density of the MOS IC has been difficult to achieve and the fabrication process has been complex.

It is, therefore, the primary object of the present invention to provide a semiconductor device which may be fabricated in a relatively simple manner and which may attain a high integration density.

SUMMARY OF THE INVENTION

A semiconductor device of the present invention has a semiconductor substrate of a first conductivity type, and a semiconductor layer of a second conductivity type opposite to the first conductivity type formed on the substrate. In this semiconductor layer are formed a first semiconductor region of the first conductivity type, this region having a low impurity concentration and being formed to be deep; and a second semiconductor region formed in a surface area of said semiconductor layer including the surface of said first semiconductor region, said second semiconductor region having an impurity concentration higher than that of said first semiconductor region and being formed to be shallower than it. A power source voltage terminal for supplying a voltage to the second semiconductor region is connected to the semiconductor substrate.

According to the present invention, the power source connecting wiring can be eliminated from the semiconductor layer and a still higher integration density can be attained.

BRIEF DESCRIPTION OF THE DRAWINGS

This invention will be more fully understood from the following detailed description when taken in conjunction with the accompanying drawings in which.

DESCRIPTION OF THE PREFERRED EMBODIMENTS

Figure 1:
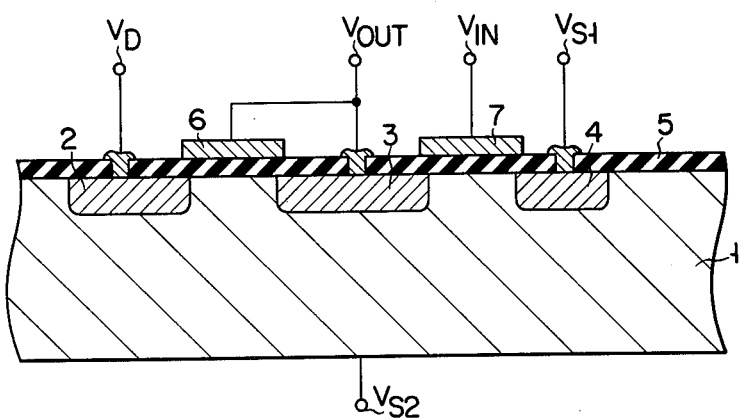
FIG. 1 is a cross sectional view of a conventional semiconductor device.

The present invention will now be described with reference to FIGS. 2 to 7. The same reference numerals denote the same parts throughout these drawings.

Figure 2:
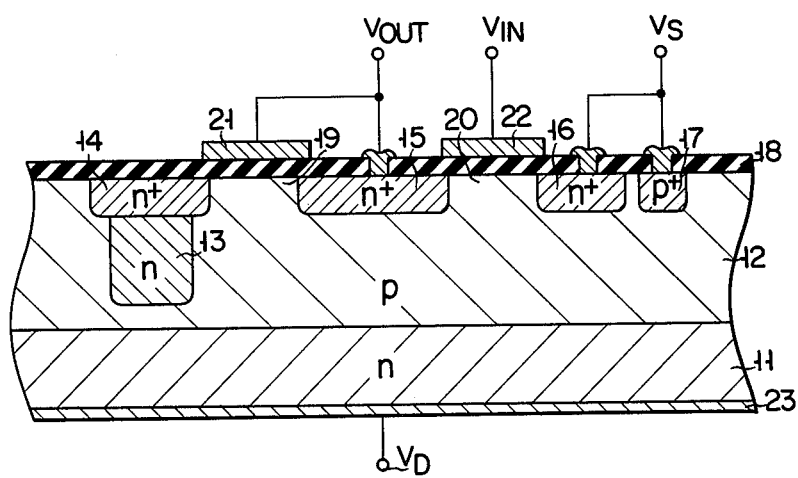
FIG. 2 is a cross sectional view of a semiconductor device according to an embodiment of the present invention.

FIG. 2 shows an example in which the present invention is applied to an E/D inverter circuit device. The semiconductor device shown in FIG. 2 has an n-type semiconductor substrate, for example, a silicon substrate 11 in which a donor impurity, e.g., antimony, is doped to a concentration of about $10^{15}/cm^3$. On this silicon substrate 11 is formed a p-type semiconductor layer, for example, an epitaxial silicon layer 12, to a thickness of, e.g., 10 to 15 μm. In it is doped an acceptor impurity, e.g., boron, to a concentration of about $10^{15}/cm^3$.

Within the silicon layer 12 and from its surface is formed, for example, by diffusion, an n-type semiconductor region 13 which is deep (generally 5 to 15 μm, e.g., 10 μm) and which has an impurity concentration (generally $10^{16}$ to $10^{20}/cm^3$, e.g., $10^{17}/cm^3$). Although this region 13 is deep, it is generally formed apart from the substrate 11. Thus, the power source voltage may be suitably varied.

In the surface area of the semiconductor layer 12 which includes the surface of the semiconductor region 13 is formed an n+-type semiconductor region 14 which has a higher impurity concentration than the semiconductor region 13 (generally $10^{19}$ to $10^{21}/cm^3$, e.g., $10^{20}/cm^3$) and which is shallower than the semiconductor region 13 (generally 0.3 to 1.0 μm, e.g., 0.5 μm). In the surface area of the semiconductor layer 12 are formed n+-type semiconductor regions 15 and 16 which are of substantially the same impurity concentration as the semiconductor region 14 and which are spaced apart from the semiconductor region 14 and from each other. These semiconductor regions 14, 15 and 16 can be simultaneously formed by diffusion. A p+-type semiconductor region 17 is formed in the surface area of the semiconductor layer 12 to establish an ohmic contact.

Conductive layers (or gate electrodes) 21 and 22 are formed on an insulation layer 18 on areas (channel portions) 19 and 20 of the semiconductor layer 12 between the semiconductor regions 14 and 15 and between the semiconductor regions 15 and 16, respectively. A donor impurity and an acceptor impurity are doped in the respective channel portions so as to make the threshold voltage respectively negative (e.g., −2 V) and positive (e.g., +1 V), as in the case of FIG. 1.

In this manner, a depletion type MOSFET having the n+-type semiconductor region 14 as a drain region and the n+-type semiconductor region 15 as a source region, and an enhancement type MOSFET having the n+-type semiconductor region 15 as a drain region and the n+-type semiconductor region 16 as a source region, are formed.

The gate electrode 21 and the source region 15 of the depletion type MOS transistor are commonly connected to the output terminal VOUT. The gate electrode 22 of the enhancement type MOS transistor is connected to the input terminal VIN, and the source region 16 is commonly grounded to a grounding terminal VS with the p+-type semiconductor region 17. The power source terminal VD is connected directly or through a metal layer 23 to the n-type semiconductor substrate 11, and a power source voltage, e.g., 5 V, is applied thereto.

The mode of operation of such an E/D type inverter circuit device is substantially the same as that shown in FIG. 1. In the device shown in FIG. 1, when the power source voltage directly applied to the drain region 2 of the depletion type MOS transistor is 5 V, the output voltage becomes high level (about 5 V) as the input voltage becomes low level (about 0 V). On the other hand, the output voltage becomes low level (about 0 V) when the input voltage becomes high level (about 5 V). Although the mode of operation of the E/D type inverter circuit device of the present invention shown in FIG. 2 is substantially the same as this, the power source voltage is applied at a different place. Thus, according to the present invention, the power source voltage is not directly applied to the drain region of the depletion type MOS transistor as in the case of the device shown in FIG. 1, but is supplied indirectly (that is, through the p-type semiconductor layer 12 and the n-type semiconductor region 13) from the substrate 11 to the drain region 14. That is to say, an npn type bipolar transistor is formed which has the n-type semiconductor substrate 11 as a collector region, the p-type semiconductor layer 12 as a base region, and the n-type semiconductor region 13 as an emitter region, and the power source voltage is supplied to the drain region 14 by turning on this bipolar transistor.

Several methods may be adopted to turn on the npn type bipolar transistor described above. According to one method leakage current above the current required to render the circuit operative for inverting operation is applied to the base region under the condition that a voltage substantially corresponding to the power source voltage is being applied. Then, the potential of the part to become the base region is raised by the distributed resistance of the semiconductor layer 12 to turn on the npn type transistor. According to another method, the part of the semiconductor layer 12 to become the base region, that is, between the semiconductor region 13 and the substrate 11, is made as thin as possible. Then, a punch-through current flows by the power source voltage to induce a voltage across the n-type semiconductor region 13.

Thus, the npn type bipolar transistor may be turned on by selecting the breakdown voltage and the leakage current between the n-type substrate 11 and the p-type layer 12, the thickness of the part of the p-type layer 12 to become the base region, the impurity concentration of the p-type layer and so on, thereby supplying the power source voltage to the drain region of the depletion type MOS transistor. The above-mentioned selection may be easily performed by those skilled in the art. A concrete example was described hereinabove.

Figure 3:
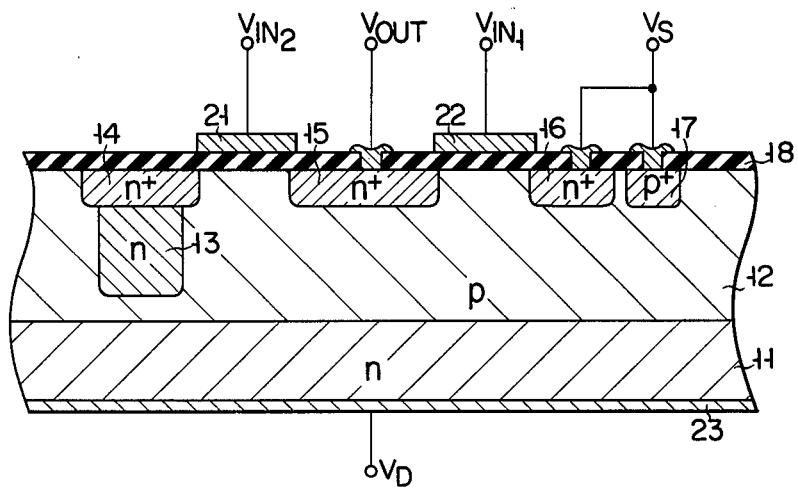
FIG. 3 is a cross sectional view of a semiconductor device according to a second embodiment of the present invention.

FIG. 3 shows a case in which an enhancement type MOS transistor is used in place of the depletion type MOS transistor in the structure shown in FIG. 2, that is, an acceptor impurity is doped in place of the donor impurity between the semiconductor regions 14 and 15. This structure functions as an enhancement-enhancement (E/E) type inverter circuit when the power source voltage is applied to the gate electrode 21, and as an E/E type push-pull buffer circuit when the gate electrode 21 is connected to another input terminal VIN2, as shown in FIG. 3.

Figure 4:
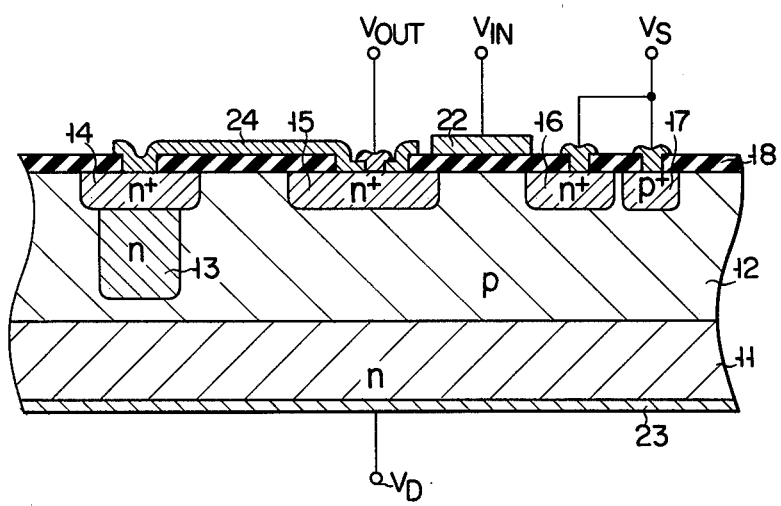
FIG. 4 is a cross sectional view of a semiconductor device according to a third embodiment of the present invention.

FIG. 4 shows a structure in which the n+-type semiconductor regions 14 and 15 in the structure shown in FIG. 2 are connected by a resistor layer, for example, a high resistance polycrystalline silicon layer 24 having a high resistance of several hundred KΩ to several MΩ. This structure functions as an enhancement-resistor type inverter circuit. Two of these structures may be combined to function as a static type memory cell.

Figure 5:
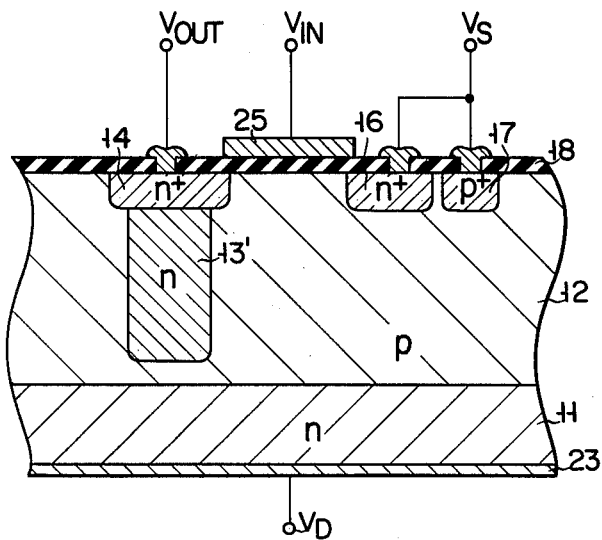
FIG. 5 is a cross sectional view of a semiconductor device according to a fourth embodiment of the present invention.

FIG. 5 shows a structure in which the depletion type MOS transistor is eliminated from the structure shown in FIG. 2 and the semiconductor region 14 (drain region) and the semiconductor region 16 (source region) constitute an enhancement type MOS transistor. A gate electrode 25 is formed on the insulation layer 18 above the area between the semiconductor regions 14 and 16. A part which may become a load resistor in this structure is an n-type semiconductor region 13′. Although it is difficult to make this a resistor of high resistance as compared with resistor layer 24 of FIG. 4, the desired object may be attained by forming it deeper than the semiconductor region 13 in an inverter circuit device which requires a relatively large current.

The present invention may be applied to a complementary MOS device by making the deep semiconductor region formed in the semiconductor layer a well region. Such examples are shown in FIGS. 6 and 7.

Figure 6:
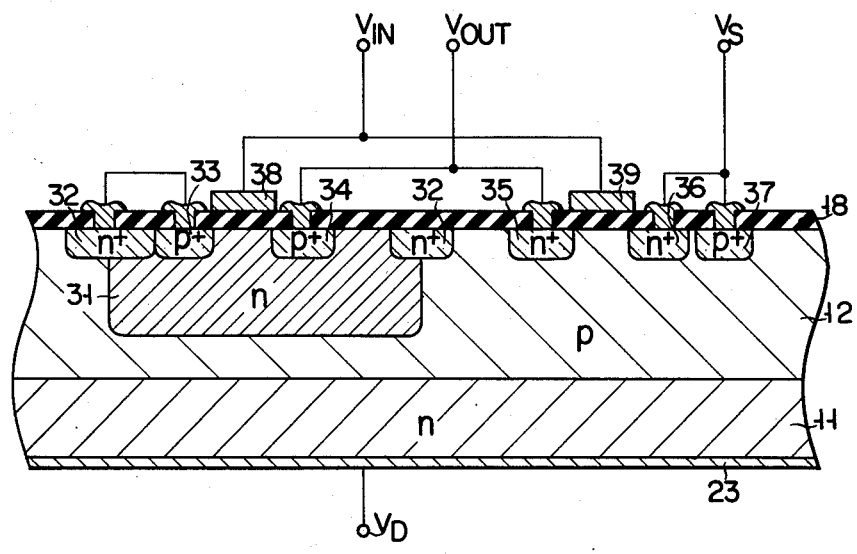
FIG. 6 is a cross sectional view of a semiconductor device according to a fifth embodiment of the present invention.
Figure 7:
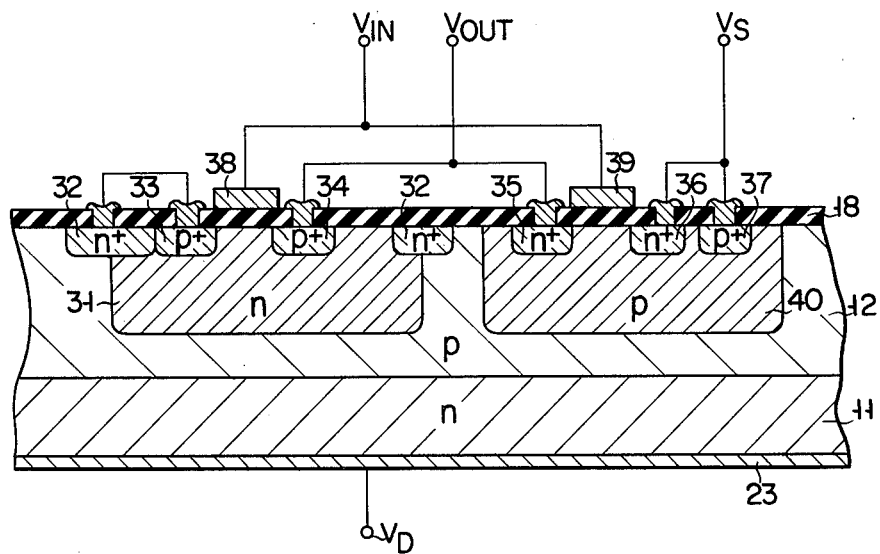
FIG. 7 is a cross sectional view of a semiconductor device according to a sixth embodiment of the present invention.

The structure shown in FIG. 6 has the n-type silicon substrate 11 and the p-type epitaxial silicon layer 12 formed on its major surface as in the case of the structure of FIG. 2. An n-type well region 31 of 8 μm depth, for example, is formed within the semiconductor layer 12, and the impurity concentration of the surface area thereof is $10^{16}/cm^3$, for example. An n+-type region 32 is formed as a guard ring for the n-type well region 31 within the surface areas of the n-type well region 31 and the semiconductor layer 12 at the boundary therebetween.

In the surface area of the n-type well region 31 are formed p+-type regions 33 and 34 to be used as the source and drain regions of the p-channel MOS transistor. In the surface area of the semiconductor layer 12 are formed n+-type regions 35 and 36 to be used as the drain and source regions of the n-channel MOS transistor. A p+-type region 37 is formed in the surface of the semiconductor layer 12 to be contiguous with the n+-type region 36.

Conductive layers (gate electrodes) 38 and 39 are formed on the insulation layer 18, above the area between the p+-type regions 33 and 34 and above the area between the n+-type regions 35 and 36, respectively.

The p+-type region 37 and the source region 36 of the n-channel MOS transistor are commonly connected to the ground terminal VS. The drain region 34 of the p-channel MOS transistor and the drain region 35 of the n-channel MOS transistor are commonly connected to the output terminal VOUT. The gate electrode 38 of the p-channel MOS transistor and the gate electrode 39 of the n-channel MOS transistor are commonly connected to the input terminal VIN. The source region 33 of the p-channel MOS transistor and the n+-type region 32 are commonly connected and placed under floating condition. The power source voltage terminal VD of, for example, 5 V, is connected to the n-type substrate 11 directly or through the metal layer 23. The voltage supplied to the power source voltage terminal VD is supplied to the n-type well region by turning on the npn type bipolar transistor having the n-type substrate 11 as a collector region, the p-type semiconductor layer 12 as a base region, and the n-type well region 31 as an emitter region, as has been already described with reference to FIG. 2.

The structure shown in FIG. 7 is basically the same as that shown in FIG. 6, except that the n+-type regions 35 and 36 are formed in the surface area of a p-type well region 40. However, with the structure shown in FIG. 7, the resistivity of the p-type semiconductor layer 12 is high (e.g., 100 Ωcm). Therefore, it is easier to turn on the npn type bipolar transistor.

It is preferable to directly supply the power source voltage to the source region and the n-type well region of the p-channel MOS transistor using metal wirings at the circuit parts which require a high current or sufficient logic level.

In summary, according to the present invention, it is possible to eliminate the power source voltage wiring of metal such as aluminum from the surface of the semiconductor layer, so that a semiconductor device with a higher integration density may be obtained. Furthermore, the process for fabricating this semiconductor device becomes extremely simple since the complex power source wiring may be eliminated by simply forming a semiconductor layer and forming a deep semiconductor region which is low in impurity concentration. In general, with a MOS type LSI, the ratio of the power source wiring area to the chip area is quite large, especially in the case of a memory cell of MOS type static memory. However, according to the present invention, the power source wiring may be eliminated from the surface of the semiconductor layer so that the chip area may be reduced by 20% or more.

A semiconductor device of opposite conductivity type may be obtained by reversing the conductivity types in the embodiments described above. Although the description has been made with reference to the case of a MOS inverter circuit, the present invention is applicable to MOS transistor circuits such as NOR gate circuits, NAND gate circuits, transmission gate circuits, buffer circuits and the like.

What is claimed is:
1. A semiconductor device comprising:
a semiconductor substrate of a first conductivity type having first and second opposite surfaces;
a semiconductor layer of a second conductivity type opposite to said first conductivity type, said semiconductor layer formed on said first surface of said substrate;
a plurality of semiconductor regions spaced apart from one another in a surface of said semiconductor layer to form an active device, said plurality of semiconductor regions including a first semiconductor region of said first conductivity type to which an operating voltage must be coupled to power said active device;
a power source voltage terminal coupled to said second surface of said substrate for receiving said operating voltage; and
coupling means for coupling said operating voltage from said power source voltage terminal to said first semiconductor region, said coupling means comprising a second semiconductor region of said first conductivity type, said second semiconductor region being formed below and in contact with said first semiconductor region, said second semiconductor region having an impurity concentration level lower than the impurity concentration level of said first semiconductor region and said second semiconductor region being formed sufficiently deep into said semiconductor layer wherein said operating voltage applied to said terminal is supplied to said first semiconductor region through said substrate, said semiconductor layer, and said second semiconductor region to power said active device.

2. A semiconductor device comprising:
a semiconductor substrate of a first conductivity type having first and second opposite surfaces;
a semiconductor layer of a second conductivity type opposite to said first conductivity type, said semiconductor layer formed on said first surface of said semiconductor substrate;
a plurality of semiconductor regions spaced apart from one another in a surface of said semiconductor layer to form an active device, said plurality of semiconductor regions including a first semiconductor region of said first conductivity type to which an operating voltage must be applied to power said active device;

a power source voltage terminal connected to said second surface of said substrate for receiving said operating voltage;

coupling means for coupling said operating voltage from said power source voltage terminal to said first semiconductor region, said coupling means comprising a second semiconductor region of said first conductivity type, said second semiconductor region being formed below and in contact with said first semiconductor region, said second semiconductor region having an impurity concentration level lower than the impurity concentration level of said first semiconductor region, and said second semiconductor region being formed sufficiently deep into said semiconductor layer wherein said operating voltage applied to said terminal is supplied to said first semiconductor region through said substrate, said semiconductor layer, and said second semiconductor region to power said active device;

a third semiconductor region of said first conductivity type and a substantially the same impurity concentration as said first semiconductor region, said third semiconductor region being formed in the surface of said semiconductor layer and spaced apart from said first semiconductor region; and a gate region formed between said first and third semiconductor regions, wherein said first semiconductor region, said third semiconductor region, and said gate region constitute a MOS type transistor.

3. A device according to claim 1 wherein said second semiconductor region is spaced apart from said semiconductor substrate.

4. A device according to claim 3 wherein one of said plurality of said semiconductor regions includes a third semiconductor region which is of the same impurity concentration as that of said first semiconductor region and which is formed in the surface of said semiconductor layer and spaced apart from said first semiconductor region.

5. A device according to claim 4 wherein said active device includes a first transistor which has said first semiconductor region as a drain region and said third semiconductor region as a source region.

6. A device according to claim 5 wherein said first transistor includes a MOS type field-effect transistor including a conductive layer formed insulatively on a surface of said semiconductor layer between said first and third semiconductor regions.

7. A device according to claim 6 wherein said MOS transistor is a depletion type.

8. A device according to claim 6 wherein said MOS transistor is an enhancement type.

9. A device according to claim 2, 7 or 8 wherein said active device further includes a second transistor which comprises a fourth semiconductor region of substantially the same impurity concentration and same impurity type as that of said first semiconductor region, said fourth semiconductor region formed in the surface of said semiconductor layer, said second transistor having said third semiconductor region as a drain and said fourth semiconductor region as a source.

10. A device according to claim 9 wherein said second transistor includes a MOS type field-effect transistor including a conductive layer formed insulatively on a surface of said semiconductor layer between said third and fourth semiconductor regions.

11. A device according to claim 4 wherein said active device comprises a resistor layer connected between said first and third semiconductor regions and formed insulatively on the surface of said semiconductor layer therebeween, and a fourth semiconductor region of substantially the same impurity concentration and same impurity type as that of said first semiconductor region; and wherein a transistor is formed having said third semiconductor region as a drain region and said fourth semiconductor region as a source region.

12. A device according to claim 11 wherein said transistor constitutes a MOS type field-effect transistor including a conductive layer formed insulatively on a surface area of said semiconductor layer between said third and fourth semiconductor regions.

13. A semiconductor device comprising:
a semiconductor substrate of a first conductivity type having first and second opposite surfaces;
a semiconductor layer of a second conductivity type opposite to said first conductivity type formed on said first surface of said semiconductor substrate;
a first semiconductor region of said first conductivity type formed in a surface of said semiconductor layer;
at least two semiconductor regions of said second conductivity type formed spaced apart from one another in a surface of said first semiconductor region to form an active device, one of said at least two semiconductor regions being a second semiconductor region of said second conductivity type to which an operating voltage must be applied to power said active device;
a power source voltage terminal connected to said second surface of said substrate for receiving said operating voltage, said first semiconductor region being formed with an impurity concentration level lower than the impurity concentration level of said second semiconductor region and said first semiconductor region being formed sufficiently deep into said semiconductor layer wherein said operating voltage applied to said terminal is supplied to said second semiconductor region through said substrate, said semiconductor layer, and said first semiconductor region to power said active device.

14. A device according to claim 13 wherein one of said at least two semiconductor regions is a third semiconductor region of said second conductivity type and of substantially the same impurity concentration as that of said second semiconductor region, which third semiconductor region is formed in the surface of said first semiconductor region and spaced apart from said second semiconductor region, wherein a transistor is formed having said second semiconductor region as a source region and said third semiconductor region as a drain region.

15. A device accoring to claim 14 wherein fourth and fifth semiconductor regions of said first conductivity type are formed in the surface of said semiconductor layer spaced apart from each other and from said first semiconductor region.

16. A device according to claim 15 wherein a transistor is formed having said fourth semiconductor region as a drain region and said fifth semiconductor region as a source region.

17. A device according to claim 16 further including a conductive layer formed insulatively on a surface of said semiconductor layer between said second and third semiconductor regions.

18. A device according to claim 17 wherein a conductive layer is formed insulatively on a surface of said semiconductor layer between said fourth and fifth semiconductor regions.

19. A device according to claim 18 further including a well region surrounding said fourth and fifth semiconductor regions.

* * * * *